(12) United States Patent
Tryon et al.

(10) Patent No.: US 11,136,672 B2
(45) Date of Patent: Oct. 5, 2021

(54) ELECTRONIC DEVICES HAVING CORROSION-RESISTANT COATINGS

(71) Applicant: Apple Inc., Cupertino, CA (US)

(72) Inventors: Brian S. Tryon, Redwood City, CA (US); Isabel Yang, San Jose, CA (US); Todd Mintz, San Jose, CA (US); Jeremy Li, San Jose, CA (US); Brian Gable, San Jose, CA (US); Lijie Bao, Saratoga, CA (US); Yi Chen, Santa Clara, CA (US); Christopher D. Prest, San Francisco, CA (US); James Yurko, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/539,944

(22) Filed: Aug. 13, 2019

(65) Prior Publication Data

US 2020/0071838 A1 Mar. 5, 2020

Related U.S. Application Data

(60) Provisional application No. 62/725,153, filed on Aug. 30, 2018, provisional application No. 62/729,911, filed on Sep. 11, 2018.

(51) Int. Cl.
*C23C 14/06* (2006.01)
*C23C 28/00* (2006.01)
*G04B 37/22* (2006.01)

(52) U.S. Cl.
CPC ............ *C23C 28/34* (2013.01); *C23C 28/321* (2013.01); *G04B 37/226* (2013.01)

(58) Field of Classification Search
CPC ........ C23C 28/34; C23C 28/321; C23C 14/06
(Continued)

(56) References Cited

U.S. PATENT DOCUMENTS

| 5,342,283 A | 8/1994 | Good |
| 6,503,373 B2 | 1/2003 | Eerden et al. |

(Continued)

FOREIGN PATENT DOCUMENTS

| CN | 1751135 A | 3/2006 |
| CN | 1778851 A | 5/2006 |

(Continued)

OTHER PUBLICATIONS

Lin, Jianliang et al., Structure and properties of CrSiN nanocomposite coatings deposited by hybrid modulated pulsed power and pulsed dc magnetron sputtering, Surface & Coatings Technology 216 (2013) 251-258.

*Primary Examiner* — Archene A Turner
(74) *Attorney, Agent, or Firm* — Treyz Law Group, P.C.; Michael H. Lyons; David K. Cole

(57) ABSTRACT

An electronic device such as a wristwatch may include a conductive housing. A corrosion-resistant coating may be deposited on the conductive housing. The coating may include transition layers and an uppermost alloy layer. The transition layers may include a chromium seed layer on the conductive housing and a chromium nitride layer on the chromium seed layer. The uppermost alloy layer may include TiCrCN or other alloys and may provide the coating with desired optical reflection and absorption characteristics. The transition layers may include a minimal number of coating defects, thereby eliminating potential sites at which visible defects could form when exposed to salt water. This may allow the electronic device to exhibit a desired color and to be submerged in salt water without producing undesirable visible defects on the conductive housing structures.

18 Claims, 9 Drawing Sheets

(58) Field of Classification Search
USPC .................. 428/336, 472, 697, 699, 216
See application file for complete search history.

(56) References Cited

U.S. PATENT DOCUMENTS

| | | | |
|---|---|---|---|
| 7,646,080 B2 | 1/2010 | Chen | |
| 7,758,233 B2 | 7/2010 | Chang et al. | |
| 8,441,799 B2 | 5/2013 | Takeuchi et al. | |
| 9,724,896 B2 | 8/2017 | Momoi et al. | |
| 10,177,803 B2 | 1/2019 | Kim et al. | |
| 10,198,040 B2 | 2/2019 | Zhang et al. | |
| 10,237,989 B1 | 3/2019 | Peters et al. | |
| 2009/0202790 A1 | 8/2009 | Eerden et al. | |
| 2012/0315453 A1* | 12/2012 | Cha | C23C 8/80 428/216 |
| 2014/0287214 A1* | 9/2014 | Cha | C23C 28/044 428/217 |
| 2016/0186307 A1 | 6/2016 | Sukadhare et al. | |
| 2016/0248077 A1 | 8/2016 | Momo et al. | |
| 2016/0265098 A1* | 9/2016 | Tsukihara | C04B 41/52 |
| 2018/0081085 A1 | 3/2018 | Ge et al. | |
| 2018/0081086 A1 | 3/2018 | Wang et al. | |
| 2019/0093228 A1 | 3/2019 | Lee et al. | |
| 2019/0252766 A1 | 8/2019 | Jeon et al. | |
| 2019/0255877 A1 | 8/2019 | Yeh et al. | |

FOREIGN PATENT DOCUMENTS

| | | | |
|---|---|---|---|
| CN | 101374976 A | | 2/2009 |
| CN | 102166849 A | | 8/2011 |
| CN | 102464923 A | | 5/2012 |
| CN | 102487590 A | | 6/2012 |
| CN | 202344616 U | | 7/2012 |
| CN | 104302803 A | | 1/2015 |
| CN | 104582333 A | | 4/2015 |
| EP | 1309733 B1 | | 5/2007 |
| JP | 2012-001901 | * | 1/2012 |
| WO | 2008007165 A1 | | 1/2008 |
| WO | 2016135047 A1 | | 9/2016 |

* cited by examiner

ELECTRONIC DEVICES HAVING CORROSION-RESISTANT COATINGS

This application claims the benefit of provisional patent application No. 62/725,153, filed Aug. 30, 2018, and provisional patent application No. 62/729,911, filed Sep. 11, 2018, which are hereby incorporated by reference herein in their entireties.

FIELD

This relates generally to coatings for electronic device structures and, more particularly, to corrosion-resistant coatings for conductive electronic device housings.

BACKGROUND

Electronic devices such as cellular telephones, computers, watches, and other devices contain housings that include conductive housing structures. The conductive housing structures are provided with a coating that reflects particular wavelengths of light so that the conductive housing structures exhibit a desired color.

It can be difficult to provide coatings that are resistant to corrosion and other environmental factors. If care is not taken, these coatings can be prone to corrosion-related damage. Corrosion-related damage can create unsightly visible defects in the coating and can undesirably deteriorate the color of the conductive housing structures.

SUMMARY

An electronic device such as a wristwatch may include conductive structures. The conductive structures may include conductive housing structures. A display may be mounted to the conductive housing structures.

A corrosion-resistant coating may be formed on the conductive housing structures. The corrosion-resistant coating may include transition layers and an uppermost alloy layer. The transition layers may include a chromium seed layer on the conductive housing structures and an additional layer on the chromium seed layer. The additional layer may also include chromium and may be, for example, a chromium nitride layer.

The uppermost alloy layer may include TiCrCN or other alloys and may provide the coating with desired optical reflection and absorption characteristics. This may configure the coating and thus the underlying conductive housing structures to exhibit a desired color. The transition layers may be deposited using physical vapor deposition techniques. The transition layers may include a minimal number of coating defects, thereby eliminating potential sites at which visible defects could form when exposed to salt water. This may allow the electronic device to exhibit a desired color and to be submerged in salt water without producing undesirable visible defects on the conductive housing structures.

DETAILED DESCRIPTION

Electronic devices and other items may be provided with conductive structures. Coatings may be formed on the conductive structures to reflect particular wavelengths of light so that the conductive structures exhibit a desired color. The coatings may be provided with layers that make the coatings corrosion-resistant (e.g., so that the visible corrosion defects do not form on the coating or the underlying conductive structures in the presence of salt water).

The corrosion-resistant coating may include transition layers on a conductive substrate. The transition layers may include a seed/adhesion layer (e.g., a metal layer that affixes the coating system to the metal substrate and forms the basis for the nitride-based color/functional component layers). The transition layers may, for example, include a chromium seed layer and other transition layers such as a chromium nitride layer. The transition layers may be deposited using physical vapor deposition techniques and may include relatively few coating defects, thereby eliminating potential sites at which visible defects could form when exposed to salt water.

The coating may include an uppermost coloring layer over the transition layers that is formed from a metal alloy selected to provide the coating with a desired color (e.g., a metallic color such as a rose gold color). In this way, the coating may provide the substrate with a desired color while also making the substrate resistant to corrosion after exposure to salt water. Illustrative configurations in which corrosion-resistant coatings are provided on conductive housing structures for electronic devices may sometimes be described herein as an example. In general, however, corrosion-resistant coatings may be formed on any suitable conductive structures.

Figure 1:
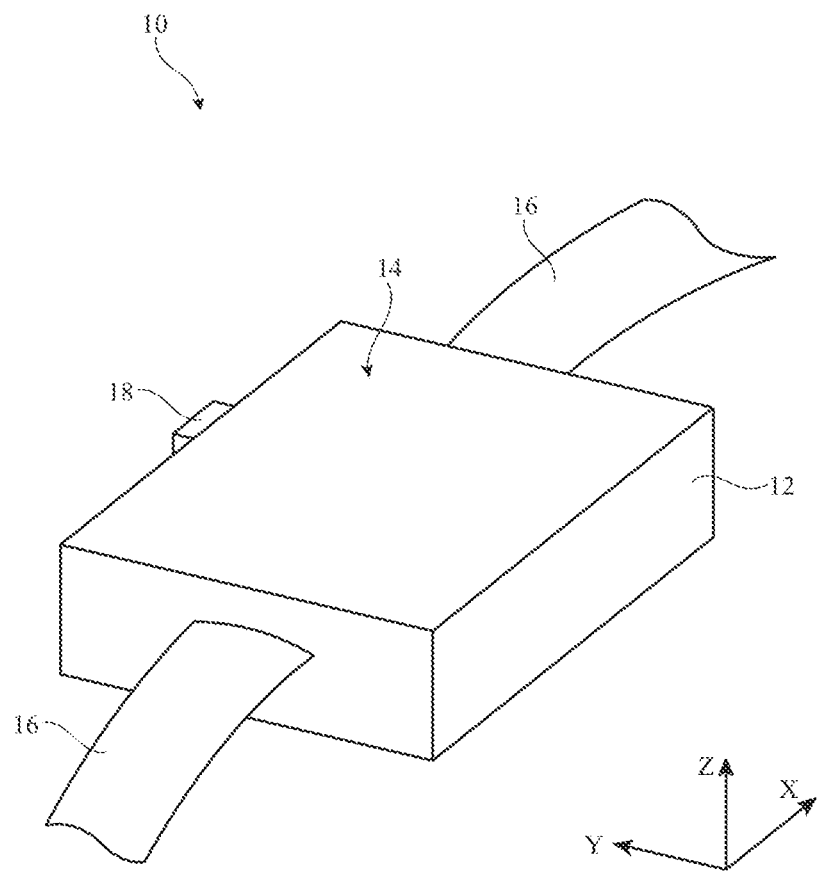
FIG. 1 is a perspective view of an illustrative electronic device of the type that may be provided with conductive housing structures with corrosion-resistant coatings in accordance with an embodiment.

An illustrative electronic device of the type that may be provided with conductive housing structures and corrosion-resistant coatings is shown in FIG. 1. Electronic device 10 of FIG. 1 may be a computing device such as a laptop computer, a computer monitor containing an embedded computer, a tablet computer, a cellular telephone, a media player, or other handheld or portable electronic device, a smaller device such as a wristwatch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a wristwatch (e.g., a smart watch). Other configurations may be used for device 10 if desired. The example of FIG. 1 is merely illustrative.

In the example of FIG. 1, device 10 includes a display such as display 14. Display 14 may be mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have metal sidewalls or sidewalls formed from other materials. Examples of metal materials that may be used for forming housing 12 include stainless steel, aluminum, silver, gold, metal alloys, or any other desired conductive material.

Display 14 may be formed at (e.g., mounted on) the front side (face) of device 10. Housing 12 may have a rear housing wall on the rear side (face) of device 10 that opposes the front face of device 10. Conductive housing sidewalls in housing 12 may surround the periphery of device 10. The rear housing wall of housing 12 may be formed from conductive materials and/or dielectric materials.

The rear housing wall of housing 12 and/or display 14 may extend across some or all of the length (e.g., parallel to the X-axis of FIG. 1) and width (e.g., parallel to the Y-axis) of device 10. Conductive sidewalls of housing 12 may extend across some or all of the height of device 10 (e.g., parallel to Z-axis).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode (OLED) display pixels, an array of electrowetting display pixels, or display pixels based on other display technologies.

Display 14 may be protected using a display cover layer. The display cover layer may be formed from a transparent material such as glass, plastic, sapphire or other crystalline dielectric materials, ceramic, or other clear materials. The display cover layer may extend across substantially all of the length and width of device 10, for example.

Device 10 may include buttons such as button 18. There may be any suitable number of buttons in device 10 (e.g., a single button, more than one button, two or more buttons, five or more buttons, etc.). Buttons may be located in openings in housing 12 or in an opening in display 14 (as examples). Buttons may be rotary buttons, sliding buttons, buttons that are actuated by pressing on a movable button member, etc. Button members for buttons such as button 18 may be formed from metal, glass, plastic, or other materials. Button 18 may sometimes be referred to as a crown in scenarios where device 10 is a wristwatch device.

Device 10 may, if desired, be coupled to a strap such as strap 16. Strap 16 may be used to hold device 10 against a user's wrist (as an example). Strap 16 may sometimes be referred to herein as wrist strap 16. In the example of FIG. 1, wrist strap 16 is connected to opposing sides of device 10. Conductive sidewalls of housing 12 may include attachment structures for securing wrist strap 16 to housing 12 (e.g., lugs or other attachment mechanisms that configure housing 12 to receive wrist strap 16). Configurations that do not include straps may also be used for device 10.

Figure 2:
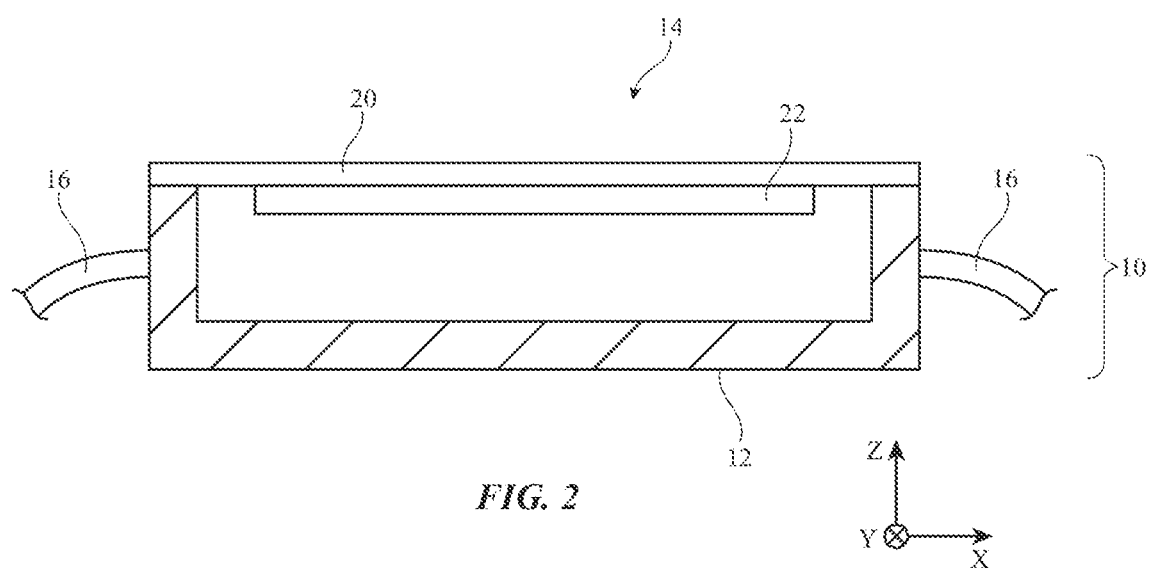
FIG. 2 is cross-sectional side view of an illustrative electronic device having conductive housing structures that may be provided with a corrosion-resistant coating in accordance with an embodiment.

A cross-sectional side view of device 10 in an illustrative configuration in which display 14 has a display cover layer is shown in FIG. 2. As shown in FIG. 2, display 14 may have one or more display layers that form pixel array 22. During operation, pixel array 22 forms images for a user in an active area of display 14. Display 14 may also have inactive areas (e.g., areas along the border of pixel array 22) that are free of pixels and that do not produce images. Display cover layer 20 of FIG. 2 overlaps pixel array 22 in the active area and overlaps electrical components in device 10.

Display cover layer 20 may be formed from a transparent material such as glass, plastic, ceramic, or crystalline materials such as sapphire. Illustrative configurations in which a display cover layer and other transparent members in device 10 (e.g., windows for cameras and other light-based devices that are formed in openings in housing 12) are formed from a hard transparent crystalline material such as sapphire (sometimes referred to as corundum or crystalline aluminum oxide) may sometimes be described herein as an example. Sapphire makes a satisfactory material for display cover layers and windows due to its hardness (9 Mohs). In general, however, these transparent members may be formed from any suitable material.

Display cover layer 20 for display 14 may planar or curved and may have a rectangular outline, a circular outline, or outlines of other shapes. If desired, openings may be formed in the display cover layer. For example, an opening may be formed in the display cover layer to accommodate a button, a speaker port, or other component. Openings may be formed in housing 12 to form communications ports (e.g., an audio jack port, a digital data port, etc.), to form openings for buttons, or to form audio ports (e.g., openings for speakers and/or microphones).

Conductive structures in device 10 such as conductive portions of housing 12 (e.g., at the exterior of device 10) may be provided with a coating that reflects certain wavelengths of light so that housing 12 exhibits a desired aesthetic appearance (e.g., a desired color, reflectivity, etc.). If care is not taken, these coatings and the underlying conductive portions of housing 12 may be susceptible to corrosion when device 10 comes into contact with water. Corrosion may be particularly high in the presence of salt water. In scenarios where device 10 is a wristwatch device, device 10 may frequently come into contact with fresh water or salt water (e.g., when the user is swimming in the ocean, swimming in a lake, swimming in a pool, in the shower, in the rain, sweating during exercise, etc.). It may therefore be desirable to be able to provide device 10 with coatings that both provide housing 12 with desired reflective properties (e.g., colors) while also being resistant to corrosion, particularly corrosion from contact with salt water. Such coatings may sometimes be referred to herein as corrosion-resistant coatings.

Figure 3:
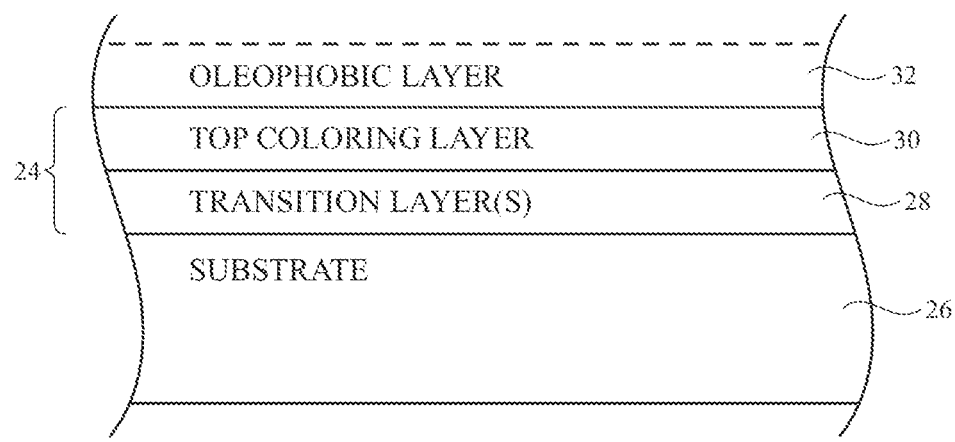
FIG. 3 is a cross-sectional side view showing how an illustrative corrosion-resistant coating may include transition layers (e.g., including metallic adhesion and seed layers) and a top coloring layer over a substrate such as a conductive housing structure in accordance with an embodiment.

An illustrative corrosion-resistant coating for conductive structures in device 10 such as conductive portions of housing 12 is shown in FIG. 3. As shown in FIG. 3, corrosion-resistant coating 24 may be formed on substrate 26. The layers of corrosion-resistant coating 24 may be deposited using any suitable deposition techniques. Examples of techniques that may be used for depositing layers in coating 24 include physical vapor deposition (e.g., evaporation and/or sputtering), cathodic arc deposition, chemical vapor deposition, ion plating, laser ablation, etc.

Substrate 26 may be a conductive structure in device 10 such as a conductive portion of housing 12 (FIGS. 1 and 2). Substrate 26 may be thicker than corrosion-resistant coating 24. The thickness of substrate 26 may be 0.1 mm to 5 mm, more than 0.3 mm, more than 0.5 mm, between 5 mm and 20 mm, less than 5 mm, less than 2 mm, less than 1.5 mm, or less than 1 mm (as examples). Substrate 26 may include stainless steel, aluminum, titanium, or other metals/alloys. Substrate 26 may include a relatively low number of inclusions to minimize defect initiation sites when coating 24 is deposited over substrate 26.

As shown in FIG. 3, coating 24 may include transition layers 28 on substrate 26 and uppermost (top) coloring layer 30 on transition layers 28. The compositions of top coloring layer 30 and/or one or more of transition layers 28 may configure coating 24 to absorb and reflect light at selected wavelengths to impart coating 24 and substrate 26 with a desired color and reflectivity. Transition layers 28 may include a seed layer that couples substrate 26 to the remaining transition layers 28.

To help prevent smudging on the outermost surface of coating 24, the outer surface of coating 24 (e.g., the outer surface of top coloring layer 30) may be provided with an antismudge layer such oleophobic layer 32. Layer 32 may be formed from a polymer such as a fluoropolymer or other material that resists smudging. Antismudge layer 32 may be relatively thin (e.g., 7 nm, less than 10 nm, 3-8 nm, more than 2 nm, etc.).

Figure 4:
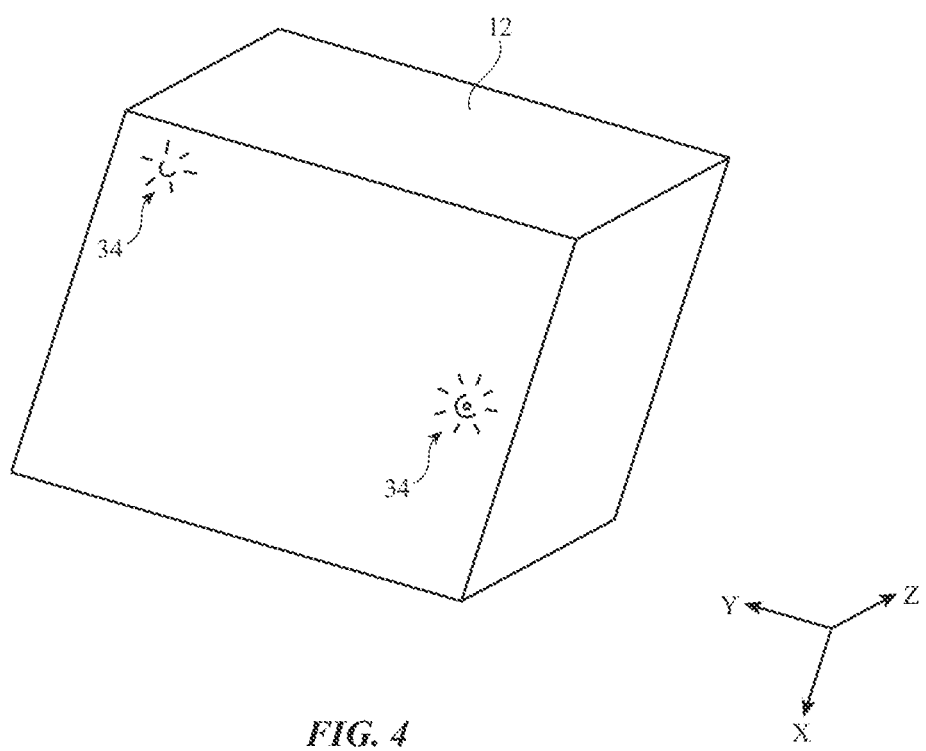
FIG. 4 is a rear perspective view of an illustrative electronic device having corrosion-related damage on conductive housing structures in accordance with an embodiment.

Transition layers 28 may include chromium and/or chromium nitride layers that exhibit relatively few coating defects upon deposition and that are thereby resistant to corrosion from the presence of water (e.g., salt water). Forming transition layers 28 using chromium and chromium nitride may allow coating 24 to exhibit lower defect density relative to scenarios where titanium and/or titanium nitride layers are used. FIG. 4 is a rear perspective view of device 10 in scenarios where a coating that does not include transition layers 28 of FIG. 3 is provided over housing 12 (e.g., a coating having titanium and/or titanium nitride transition layers).

As shown in FIG. 4, this type of coating would subject conductive portions of housing 12 to corrosion in the presence of salt water. The corrosion generates visible defects 34 on the surface of housing 12. Visible defects 34 include discoloration of housing 12 and/or visible pitting in housing 12, as examples. Visible defects 34 may be formed at locations (sites) where there are coating defects in the coating on housing 12.

Figure 5:
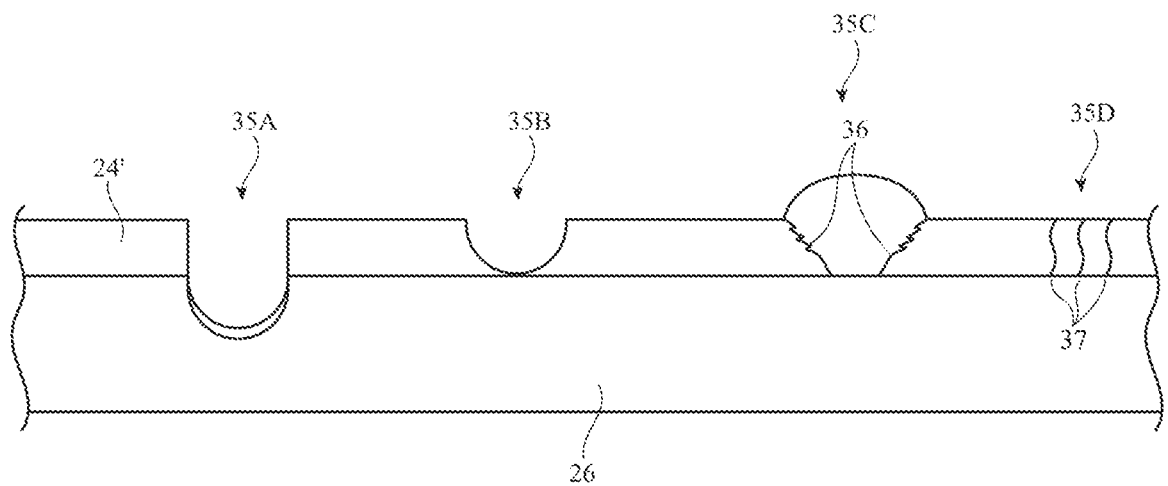
FIG. 5 is a cross-sectional side view of potential corrosion initiation sites based on material-related defects that may arise in non-corrosion-resistant coatings in accordance with an embodiment.

All coatings have inherent defects, whether from the coating process or the coating's inability to cover substrate defects (e.g., inclusions, etc.). FIG. 5 is a cross-sectional side view of different coating defects 35 that may be present on housing 12 and that may lead to visible defects 34 of FIG. 4. As shown in FIG. 5, a coating 24' (e.g., a coating without chromium/chromium nitride transition layers 28 of FIG. 3 such as a coating having titanium/titanium nitride transition layers) may be provided over substrate 26 (e.g., housing 12 of FIG. 4). Coating 24' may include coating defects 35 such as pitting 35A (i.e., pitting that extends through coating 24' and into substrate 26) and pitting 35B (i.e., pitting that extends through coating 24' but not into substrate 26). Coating defects 35 can also include protrusion defects 35C generated at cracks 36 in coating 24' and boundary defects 35D formed at grain boundaries 37 in coating 24'.

Coating defects such as coating defects 35A, 35B, 35C, and 35D may lead to visible defects 34 of FIG. 4 when exposed to salt water. For example, electrolytes in the salt water may galvanically couple the coating to substrate 26 at the location of defects 35A, 35B, 35C, or 35D. This may produce oxidation such as rust deposits on the outer surface of coating 24' and/or on exposed portions of substrate 26. These rust deposits alter the color and appearance of the coating and substrate, leading to visible defects 34 of FIG. 4.

Transition layers 28 of FIG. 3 (e.g., transition layers that include chromium and chromium nitride) may have a lower defect density than other transition layers such as titanium and titanium nitride transition layers (e.g., corrosion-resistant coating 24 of FIG. 3 will exhibit fewer defects such as defects 35 of FIG. 5 than titanium and titanium nitride transition layers). Because transition layers 28 have relatively few (e.g., zero) defects 35, housing 12 may be provided with a desired color (e.g., by corrosion-resistant coating 24) without the generation of visible defects 34 (FIG. 4) after exposure to salt water.

Figure 6:
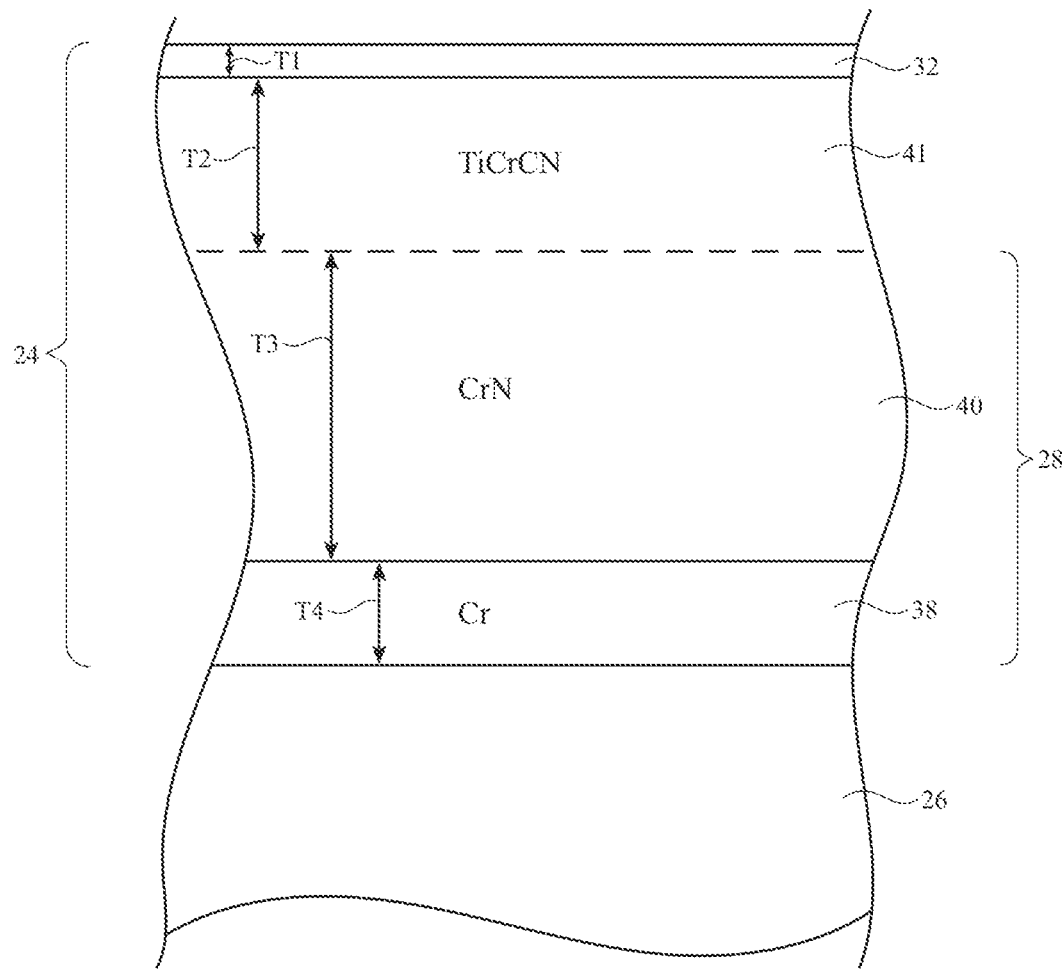
FIG. 6 is a cross-sectional side view of an illustrative corrosion-resistant coating having chromium and chromium nitride transition layers in accordance with an embodiment.

FIG. 6 is a cross-sectional diagram showing one example of layers that may be included in corrosion-resistant coating 24. Coating 24 reduces or minimizes the total number of defects by providing a low inclusion-containing substrate with a coating system that is tailored to have fewer inherent defects (e.g., relative to coating 24' of FIG. 5). As shown in FIG. 6, transition layers 28 in coating 24 may include a chromium seed layer such as chromium layer 38 and a chromium nitride transition layer such as chromium nitride (CrN) layer 40. Chromium layer 38 may be coated over substrate 26. Chromium nitride layer 40 may be coated over chromium layer 38. Top (uppermost) coloring layer 30 may include an alloy layer such as titanium-chromium-carbon-nitrogen (TiCrCN) layer 41 coated over chromium nitride layer 40 (e.g., an alloy layer that includes titanium, chromium, carbon, and nitrogen). Optional antismudge layer 32 may be provided over TiCrCN layer 41 if desired.

Antismudge layer 32 has thickness T1. TiCrCN layer 41 has thickness T2. Chromium nitride layer 40 has thickness T3. Chromium layer 38 has thickness T4. Thickness T1 may be less than each of thicknesses T2, T3, and T4. Each of thicknesses T1, T2, T3, and T4 (and the total thickness of coating 24) may be less than the thickness of substrate 26. The total thickness of coating 24 may be, for example, between 1.0 micron and 2.0 microns, between 1.2 microns and 1.8 microns, between 0.5 microns and 2.5 microns, less than 0.5 microns, or greater than 2.5 microns. In the example of FIG. 6, thickness T4 is less than thickness T2 and thickness T2 is less than thickness T3. This is merely illustrative and, in general, thicknesses T2, T3, and T4 may have any desired values (e.g., other relative thicknesses may be used if desired).

Chromium nitride layer 40 and chromium layer 38 may have a low defect density after deposition (e.g., physical vapor deposition). This may serve to mitigate visible defects (e.g., visible defects 34 of FIG. 4) on substrate 26 after exposure to salt water. If desired, chromium nitride layer 40 and chromium layer 38 may help to adhere top TiCrCN layer 41 to substrate 26 and/or may contribute to the color profile of coating 24. Coating 24 may exhibit a hardness of greater than 1500 nHVN, as an example.

TiCrCN layer 41 may provide coating 24 with desired light reflecting properties so that coating 24 reflects desired wavelengths of light. This may impart coating 24 and thus substrate 26 (e.g., housing 12 of FIGS. 1 and 2) with desired aesthetic properties such as a desired color, reflectivity, luster, etc. As an example, layer 41 may provide coating 24 and housing 12 with a light red or red-gold color (e.g., a rose gold or blush gold color). The composition of TiCrCN layer 41 may be selected to adjust the light absorption and reflection properties of coating 24.

Figure 7:
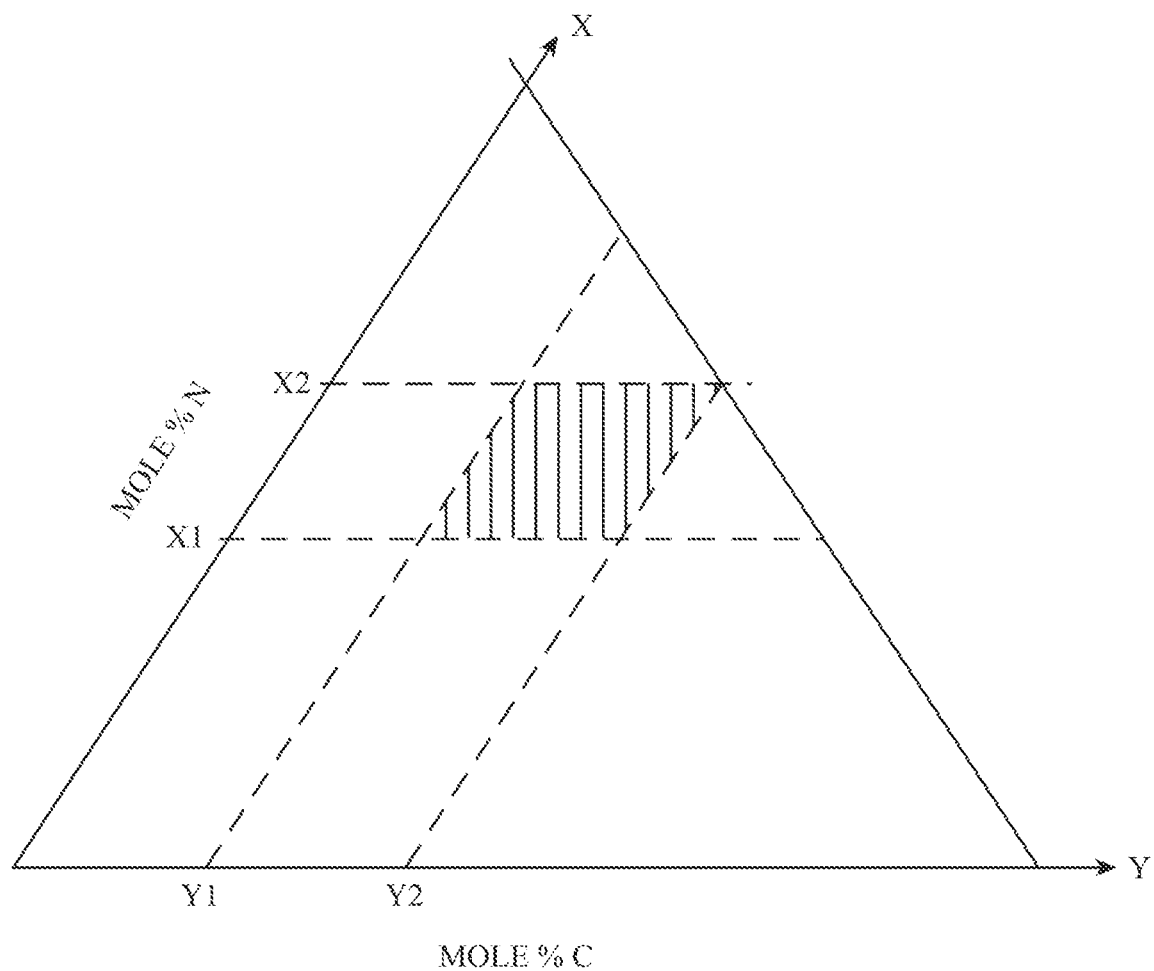
FIG. 7 is a plot of illustrative nitrogen and carbon content in a top color layer of a corrosion-resistant coating of the type shown in FIG. 6 in accordance with an embodiment.

FIG. 7 is an exemplary plot of the chemical composition of TiCrCN layer 41. The X-axis of FIG. 7 plots the molar % of nitrogen in layer 41 whereas the Y-axis plots the molar % of carbon in layer 41. Layer 41 may have a molar % of nitrogen between limits X1 and X2 and a molar % of carbon between limits Y1 and Y2. Limit X1 may be, for example, 30%, 35%, 20%, 25%, between 20% and 40%, between 25% and 35%, between 27% and 33%, or other values. Limit X2 may be, for example, 40%, 45%, 30%, 35%, between 30% and 50%, between 35% and 45%, between 37% and 43%, or other values greater than limit X1. Limit Y1 may be, for example, 10%, 15%, between 10% and 15% (e.g., 13%, 14%, etc.), between 5% and 20%, or other values. Limit Y2 may be, for example, 20%, 25%, between 20% and 25% (e.g., 22%, 23%, etc.), between 15% and 25%, or other values greater than limit Y1. In general, the sum of the molar % of nitrogen and the molar % of carbon in layer 41 may be between 45% and 55%, between 44% and 54%, between 40% and 60%, etc. By bounding the chemical composition in this way, coating 24 may provide housing 12 with a desired color and other aesthetic characteristics.

The example of FIG. 7 is merely illustrative. The plot of FIG. 7 may include an additional dimension (not shown) plotting the molar % of chromium. As an example, layer 41 may include between 2% and 10%, between 1% and 11%, between 3% and 9%, between 4% and 8%, or other amounts of chromium. Coating 24 may be provided with other reflective characteristics to provide housing 12 with other colors. ZrCrCN or TiZrCrCN may be used to form layer 41 (e.g., while providing coating 24 with similar color characteristics to TiCrCN).

FIGS. 8-13 show examples of different layers that may be used to form coating 24 with different reflective characteristics (e.g., colors). Optional antismudge layer 32 is omitted from FIGS. 8-13 for the sake of clarity.

Figure 8:
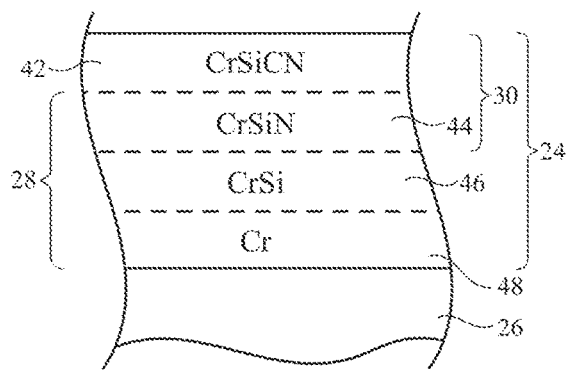
FIGS. 8-13 are cross-sectional side views of illustrative corrosion-resistant coatings of different colors having chromium nitride-based transition layers in accordance with an embodiment.

As shown in FIG. 8, transition layers 28 in coating 24 may include a chromium seed layer such as chromium layer 48 on substrate 26, a chromium-silicon (CrSi) transition layer 46 on chromium layer 48, and a chromium-silicon-nitrogen (CrSiN) transition layer 44 on CrSi layer 46. Top coloring layer 30 may include a chromium-silicon-carbon-nitrogen (CrSiCN) layer 42 (e.g., an alloy layer including chromium, silicon, carbon, and nitrogen) on CrSiN layer 44. Coating 24 of FIG. 8 may, for example, provide housing 12 with a corrosion-resistant grey color.

Figure 9:
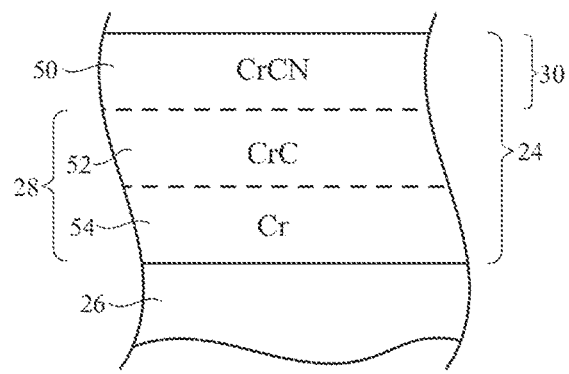

As shown in FIG. 9, transition layers 28 in coating 24 may include a chromium seed layer such as chromium layer 54 on substrate 26 and a chromium-carbon (CrC) transition layer 52 on chromium layer 54. Top coloring layer 30 may include a chromium-carbon-nitrogen (CrCN) layer 50 (e.g., an alloy layer including chromium, carbon, and nitrogen) on CrC layer 52. Coating 24 of FIG. 9 may, for example, provide housing 12 with a corrosion-resistant black color.

Figure 10:
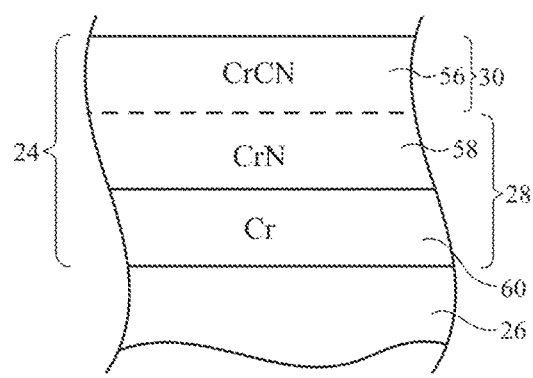

As shown in FIG. 10, transition layers 28 in coating 24 may include a chromium seed layer such as chromium layer 60 on substrate 26 and a chromium nitride transition layer 58 on chromium layer 60. Top coloring layer 30 may include chromium-carbon-nitrogen (CrCN) layer 56 on chromium nitride layer 58. Coating 24 of FIG. 10 may, for example, provide housing 12 with a corrosion-resistant bronze color.

Figure 11:
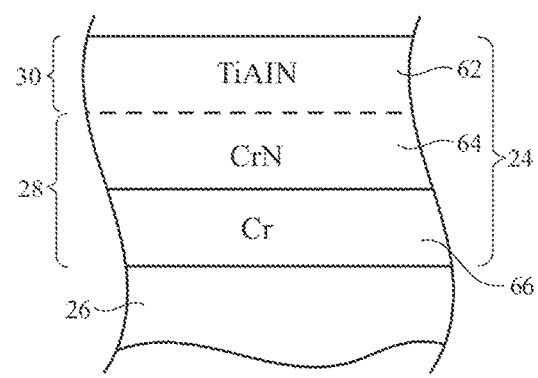

As shown in FIG. 11, transition layers 28 in coating 24 may include a chromium seed layer such as chromium layer 66 on substrate 26 and a chromium nitride transition layer 64 on chromium layer 66. Top coloring layer 30 may include titanium-aluminum-nitrogen (TiAlN) layer 62 (e.g., an alloy layer including titanium, aluminum, and nitrogen) on chromium nitride layer 64. Coating 24 of FIG. 11 may, for example, provide housing 12 with a corrosion-resistant blue color.

Figure 12:
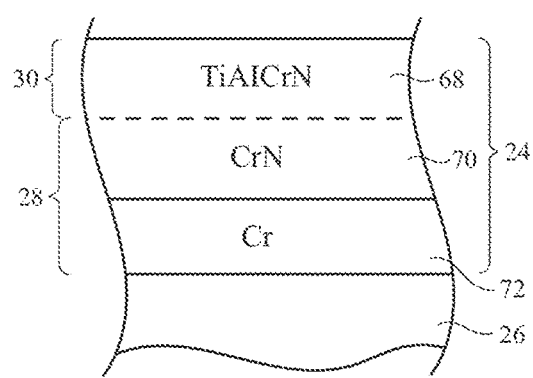

As shown in FIG. 12, transition layers 28 in coating 24 may include a chromium seed layer such as chromium layer 72 on substrate 26 and a chromium nitride transition layer 70 on chromium layer 72. Top coloring layer 30 may include titanium-aluminum-chromium-nitrogen (TiAlCrN) layer 68 (e.g., an alloy layer including titanium, aluminum, chromium, and nitrogen) on chromium nitride layer 70. Coating 24 of FIG. 12 may, for example, provide housing 12 with a corrosion-resistant green color.

Figure 13:
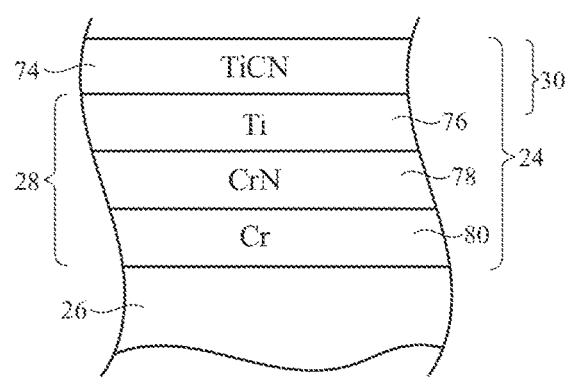

As shown in FIG. 13, transition layers 28 in coating 24 may include a chromium seed layer such as chromium layer 80 on substrate 26, a chromium nitride transition layer 78 on chromium layer 80, and a titanium layer 76 on chromium nitride transition layer 78. Top coloring layer 30 may include titanium-carbon-nitrogen (TiCN) layer 74 (e.g., an alloy layer including titanium, carbon, and nitrogen) on titanium layer 76. Coating 24 of FIG. 13 may, for example, provide housing 12 with a brick red color.

The examples of FIGS. 6-13 are merely illustrative. In general, coating 24 may be provided with any desired layers to provide housing 12 with any desired optically reflective properties (e.g., colors). Chromium-including transition layers 28 may minimize coating defects in coating 24 to thereby mitigate visual defects in coating 24 and housing 12 after exposure to salt water. In some suitable arrangements, layer 30 of coating 24 may be a ZrCrCN or TiZrCrCN layer. If desired, zirconium (Zr) may be used to replace titanium (Ti) in any of the layers of coating 24 described in connection with FIGS. 6-13. Substrate 26 may include low-inclusion stainless steel in one example (e.g., SUS 316Li or other stainless steels having an inclusion count less than 75, 50, 20, or 15 per 10,000 square microns or other area).

The foregoing is merely illustrative and various modifications can be made to the described embodiments. The foregoing embodiments may be implemented individually or in any combination.

What is claimed is:

1. An electronic device, comprising:
   a conductive housing structure; and
   a coating on the conductive housing structure, the coating comprising:
      a chromium seed layer on the conductive housing structure,
      a chromium nitride layer on the chromium seed layer, and
      a TiCrCN layer on the chromium nitride layer.
2. The electronic device defined in claim 1, wherein the TiCrCN layer is an uppermost layer of the coating.

3. The electronic device defined in claim 1, further comprising an antismudge layer on the TiCrCN layer.

4. The electronic device defined in claim 1, wherein the conductive housing structure comprises stainless steel having an inclusion count less than 75 per 10,000 square microns.

5. The electronic device defined in claim 1, wherein the electronic device has opposing front and rear faces, the electronic device further comprising:
   a display at the front face, wherein the conductive housing structure comprises a conductive wall at the rear face.

6. The electronic device defined in claim 1, wherein the coating has a total thickness between 1.0 micron and 2.0 microns.

7. The electronic device defined in claim 6, wherein the TiCrCN layer has a first thickness, the chromium nitride layer has a second thickness greater than the first thickness, and the chromium seed layer has a third thickness less than the first thickness.

8. The electronic device defined in claim 1, wherein the TiCrCN layer has a molar % of nitrogen between 25% and 35%, a molar % of carbon between 10% and 25%, and a molar % of chromium between 1% and 10%.

9. An electronic device comprising:
   a display;
   a conductive housing wall; and
   a coating on the conductive housing wall that configures the conductive housing wall to exhibit a given color, the coating comprising:
      a chromium seed layer on the conductive housing wall,
      a transition layer on the chromium seed layer, the transition layer comprising chromium, and
      an uppermost alloy layer comprising nitrogen.

10. The electronic device defined in claim 9, wherein the transition layer comprises a chromium nitride layer.

11. The electronic device defined in claim 10, wherein the uppermost alloy layer comprises a TiCrCN layer.

12. The electronic device defined in claim 10, wherein the uppermost alloy layer comprises a CrCN layer.

13. The electronic device defined in claim 10, wherein the uppermost alloy layer comprises a TiAlN layer.

14. The electronic device defined in claim 10, wherein the uppermost alloy layer comprises a TiAlCrN layer.

15. The electronic device defined in claim 10, wherein the uppermost alloy layer comprises a TiCN layer and the coating further comprises a titanium layer interposed between the chromium nitride layer and the TiCN layer.

16. The electronic device defined in claim 9, wherein the transition layer comprises a CrSi layer, the uppermost alloy layer comprises a CrSiCN layer, and the coating further comprises a CrSiN layer interposed between the CrSi layer and the CrSiCN layer.

17. The electronic device defined in claim 9, wherein the transition layer comprises a CrC layer and the uppermost alloy layer comprises a CrCN layer.

18. An electronic device, comprising:
   a stainless steel housing structure;
   a corrosion-resistant coating on the stainless steel housing structure, wherein the corrosion-resistant coating comprises a chromium nitride layer and an uppermost coloring layer; and
   an oleophobic coating on the corrosion-resistant coating.

* * * * *